United States Patent [19]

Chen

[11] Patent Number: 5,408,126
[45] Date of Patent: Apr. 18, 1995

[54] MANUFACTURE OF SEMICONDUCTOR DEVICES AND NOVEL LEAD FRAME ASSEMBLY

[75] Inventor: Yang C. Chen, Whitehall Township, Lehigh County, Pa.

[73] Assignee: AT&T Corp., Murray Hill, N.J.

[21] Appl. No.: 168,706

[22] Filed: Dec. 17, 1993

[51] Int. Cl.[6] .................... H01L 23/48; H01L 29/44; H01L 29/52; H01L 29/60

[52] U.S. Cl. .................... 257/666; 257/730; 257/735; 257/693

[58] Field of Search ............... 257/711, 710, 730, 704, 257/735, 666, 693, 723, 724, 659, 664

[56] References Cited

U.S. PATENT DOCUMENTS

| | | | |
|---|---|---|---|
| 3,629,668 | 12/1971 | Hingorany | 317/234 |
| 3,786,375 | 1/1974 | Sato et al. | 257/664 |
| 4,445,274 | 5/1984 | Suzuki et al. | 257/704 |
| 4,714,952 | 12/1987 | Takeawa | 357/75 |
| 4,751,611 | 6/1988 | Arai | 361/421 |
| 4,829,403 | 5/1989 | Harding | 361/386 |
| 4,839,713 | 6/1989 | Teraoka | 357/70 |
| 5,018,005 | 5/1991 | Lin et al. | 257/730 |
| 5,049,977 | 9/1991 | Sako | 357/72 |
| 5,223,739 | 6/1993 | Katsumata | 257/676 |
| 5,256,901 | 10/1993 | Ohashi et al. | 257/710 |
| 5,281,849 | 1/1994 | Singh Deo et al. | 257/693 |

FOREIGN PATENT DOCUMENTS

| | | | |
|---|---|---|---|
| 56-62342 | 5/1981 | Japan | 257/711 |
| 60-38844 | 2/1985 | Japan | 257/704 |

Primary Examiner—Andrew J. James
Assistant Examiner—S. V. Clark

[57] ABSTRACT

A lead frame assembly comprises a lead frame having cantilevered leads. Combined with the lead frame is a rigid, elongated base member having a U-shaped cross-section and laterally outwardly extending flanges at the upper ends of side walls of the base member. The leads of the lead frame overlie the base member flanges and are bonded to conductive paths on the flanges which extend along the flanges, along the base member side walls and onto the bottom wall of the base member. In use, a semiconductor chip is mounted on the bottom wall and wire bonded to respective ones of the conductive paths. Two base members can be used in flange-to-flange contacting relationship to provide a tubular enclosure for the chip.

12 Claims, 3 Drawing Sheets

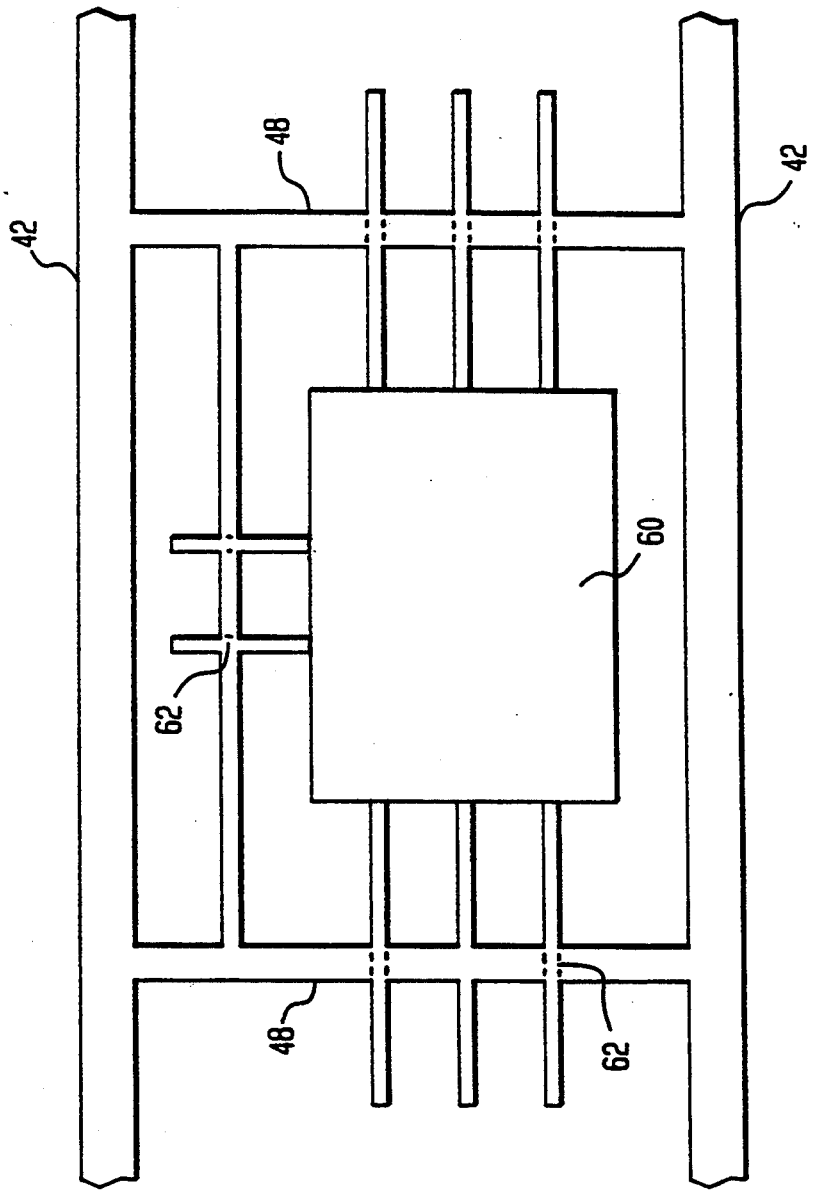

MANUFACTURE OF SEMICONDUCTOR DEVICES AND NOVEL LEAD FRAME ASSEMBLY

BACKGROUND OF THE INVENTION

This invention relates to the manufacture of semiconductor devices, and particularly to the use of novel lead frame assemblies in such manufacture and to the resulting devices.

The use of lead frames in the manufacture of semiconductor devices is known. Such lead frames generally comprise a flat sheet of metal which is partially etched away to leave a pattern of narrow leads which converge towards a central area of the pattern. Commonly, one of the leads extends beyond the others and expands, within the lead frame central area, into a chip mounting pad.

In use, a semiconductor chip is mounted on the mounting pad. The upper surface of the chip contains a number of peripherally spaced bonding pads each connected, via runners on the chip, to various circuit components contained within the chip. Bonding wires are bonded between the lead ends and respective ones of the chip bonding pads. Thereafter, the chip, the bonding wires and the inner ends of the leads are all encapsulated in a plastic enclosure. Then, surrounding portions of the lead frame external to the enclosure are cutaway leaving a plurality of terminal leads extending outwardly from the enclosure.

Examples of various lead frame arrangements and manufacturing processes using them are disclosed in the following U.S. patents, the subject matter of which are incorporated herein by reference: U.S. Pat. Nos. 4,714,952 (Takekawa et al); 4,829,403 (Harding); 4,839,713 (Teraoka et al); 3,629,668 (Hingorany); 4,751,611 (Arai); 5,049,977 (Sako) and 5,223,739 (Katsumata).

The present invention provides a variation over known lead frame assemblies and provides certain manufacturing advantages. Additionally, the present invention facilitates the incorporation of two or more chips within a single enclosure.

SUMMARY OF THE INVENTION

A lead frame assembly comprises a conventional type lead frame, e.g., a plurality of interconnected terminal leads having free ends converging towards a common area. Combined with the lead frame is a rigid base member of an insulating material, the base member having a generally dished configuration and, in one embodiment, comprising an elongated, trough-shaped member, i.e., having a U-shaped cross-section including a bottom wall and upwardly extending side walls. Flanges extend laterally outwardly from the upper ends of the side walls and along the entire length of the trough-shaped member. Disposed on the inside surface of the bottom wall are a plurality of conductive paths having leading ends which converge towards a central area of the bottom wall. From the bottom wall, the other ends of the conductive paths extend upwardly along the side walls of the member and then laterally outwardly, in parallel directions, along the flanges. The lead frame overlies the base member with the free ends of the frame leads overlying and bonded to respective ones of the conductive paths on the flanges.

In use of the assembly, a semiconductor chip is bonded to the bottom wall of the base member within the central area thereof. Bonding wires are bonded to the leading ends of the conductive paths on the bottom wall and to respective ones of bonding pads on the upper surface of the chip. Then, the entire base member, including the chip mounted thereon, is encapsulated in an enclosure with ends of the leads of the lead frame extending outwardly from the enclosure.

In an alternative use, a complete lead frame assembly, as above-described, including a chip mounted thereon, is used in combination with an additional base member also including a chip mounted thereon. The additional base member is disposed in inverted relation with the base member of the complete lead frame assembly with the flanges of the two base members overlapping and sandwiching therebetween the leads from the lead frame associated with the complete assembly. Conductive paths on the flanges of the additional base member overlie respective ones of the leads of the lead frame and are bonded thereto. Accordingly, terminal leads are provided for the chip in the additional base member and, as desired, electrical interconnections are provided between the two chips within the composite assembly.

DESCRIPTION OF THE DRAWING

FIG. 3 is a view similar to FIG. 1 but showing the assembly partially enclosed within a molded plastic enclosure.

DESCRIPTION OF PREFERRED EMBODIMENTS OF THE INVENTION

Figure 1:
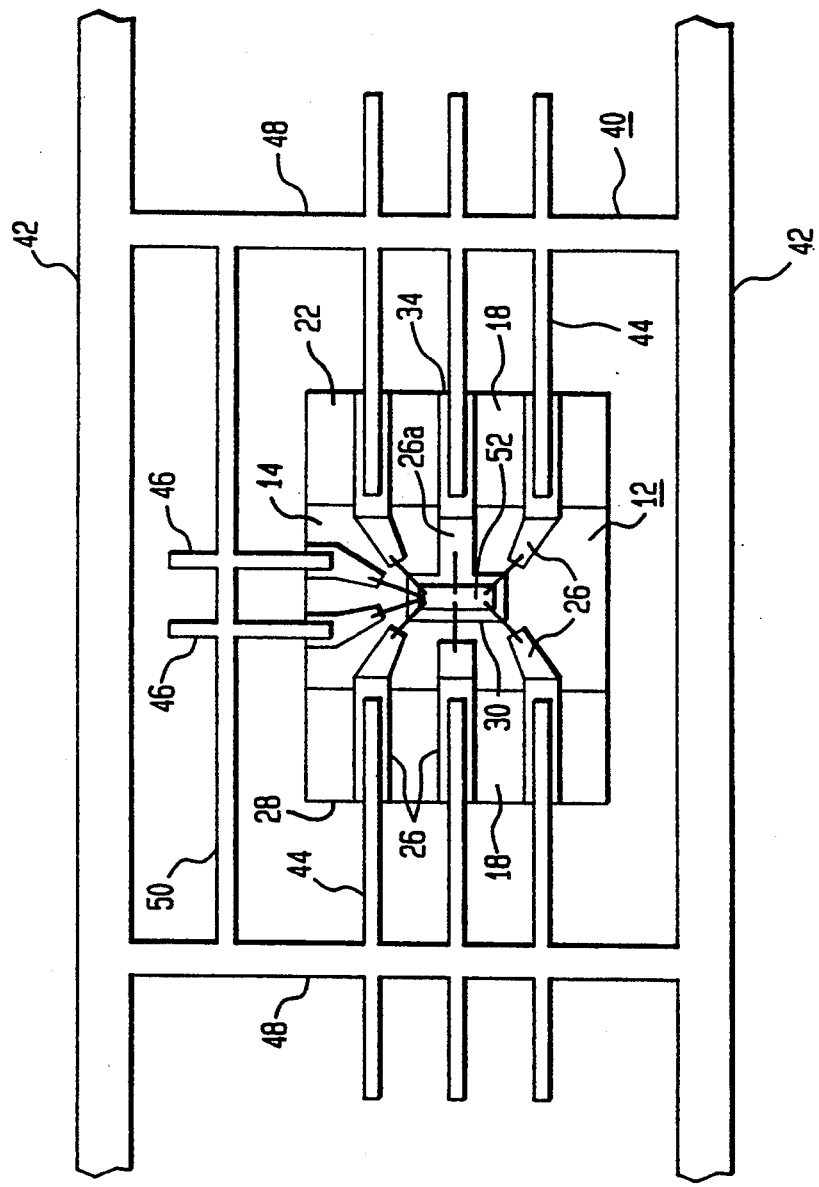
FIG. 1 is a plan view of a lead frame assembly in accordance with this invention and showing a semiconductor chip bonded in place in the assembly.
Figure 2:
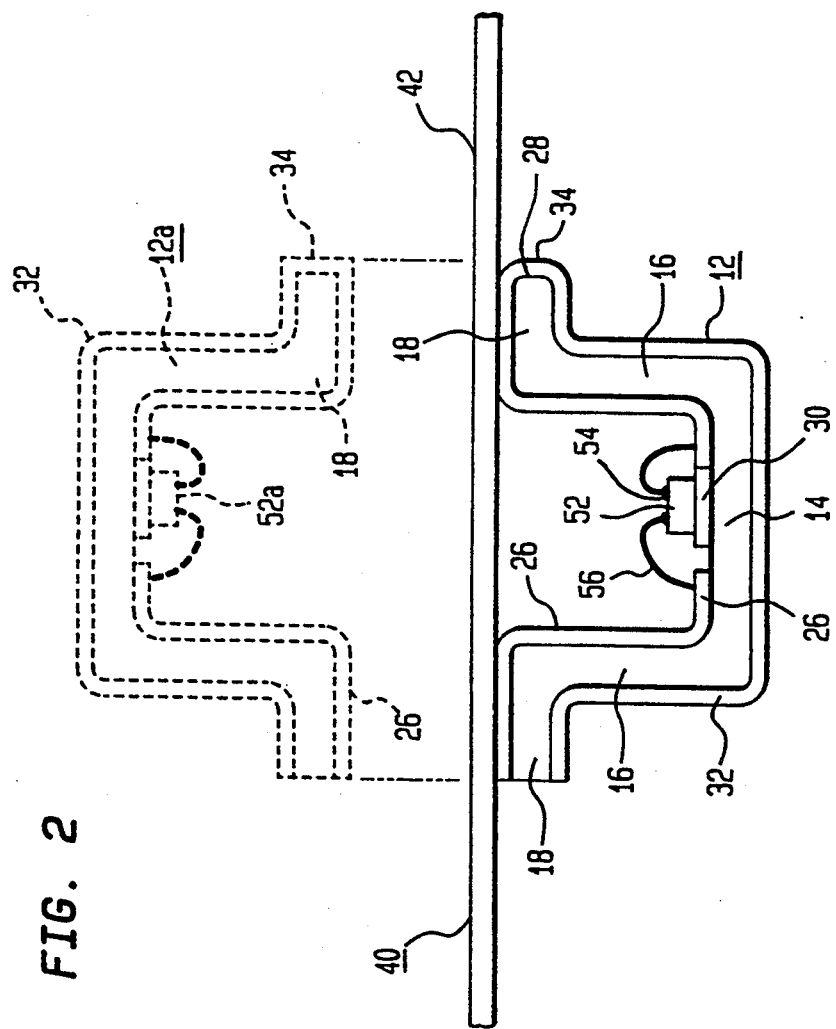
FIG. 2 is an end view of the assembly shown in FIG. 1 and showing, in dashed lines, and in exploded relationship, a second base member which can be used with the assembly shown in solid lines.

With reference to FIGS. 1 and 2, a base member 12 in accordance with this invention is shown. The base member 12 has a generally dished configuration, that is, it comprises a bottom wall completely or partially surrounded by a side wall or walls. In a preferred embodiment, the base member 12 has a U-shaped cross-section including a flat, bottom wall 14, and vertical side walls 16. Disposed at the upper end of each of the side walls 16 is a laterally extending flange 18. Although the exact shape of the base member is not critical, it is generally elongated, as illustrated, with the flanges 18 extending along the entire length of the member.

The base member 12 is preferably formed of materials commonly used in the semiconductor industry, e.g., various plastics and ceramics. A preferred material is a polymer film type material. The dimensions of the base member are not critical and are a function of the size and the terminal lead requirements of the semiconductor chip used therewith. Preferably, the thickness of the walls of the base member are sufficiently thick to provide the base member with rigidity and strength.

Disposed on the inside surfaces of the bottom wall 14 and the side walls 16 and on the upper surfaces 22 of the flange 18 are a plurality of separate conductive paths 26, e.g., of copper. Each path 26 is continuous and extends from an edge 28 of the flange on which it is disposed, along the flange surface towards the corresponding side wall 16, down the side wall, and along the inner surface of the bottom wall 14 towards (in this embodiment of the invention) a metal pad 30 disposed on a central portion of the bottom wall. One or more of the conductive paths 26 connects with the pad 30, but the remainder of the paths terminate short thereof.

In other embodiments of the invention, not illustrated, the central portion of the base member towards which the conductive paths converge is not coated with metal, but is bare.

Also, a continuous and unpatterned layer 32 of metal, e.g., copper, covers the outside surfaces of the bottom wall 14 and the side walls 16 and the bottom surfaces of the flanges 18. An extension 34 of the unpatterned layer 32 is disposed on the side edge 28 of one of the flanges and connects to a one (26a) of the conductive paths 26 which is connected to the metal pad 30 on the bottom wall 14.

Fabrication of the base member 12 can be by conventional processes, e.g., shaping a "green" ceramic into the trough-like shape and baking it, or pouring a fluid plastic material into a mold and curing the material. The various conductive paths 26 and unpatterned layer 32 of metal on the base member 12 can be provided by known electroless plating and subsequent photolithographic patterning processes.

Used in combination with the base member 12 is a lead frame 40 which can be of conventional design and materials. By way of example, the lead frame 40 comprises a pair of side rails 42 having mounted thereon a plurality of elongated leads 44 and 46. The leads 44 are mounted on, and extend in opposite directions from, a pair of support bars 48 extending between the side rails 42. The leads 46 are mounted on, and extend in opposite directions from, a support bar 50 which extends between and is secured to the pair of support bars 48.

The lead frame 40 can be formed, for example, from copper and can be fabricated using conventional processes, e.g., stamping or etching.

FIGS. 1 and 2 show a complete lead frame assembly, comprising a base member 12 and a lead frame 40 bonded thereto. Also shown on the assembly is a semiconductor chip 52. The complete assembly, including the chip 52, is formed as follows.

Starting with the base member 12 by itself, it is most convenient to first mount a semiconductor chip 52 on the base member 12 and to wire bond bonding pads 54 on the chip surface to respective ones of the base member conductive paths 26. Such mounting and wire bonding can be done using conventional processes and machines. Preferably, the chip is first adhered to the inner surface of the base member bottom wall 14, as by being soldered to the metal pad 30 if present, or adhesively bonded directly to the inner surface of the bottom wall 14. Bonding wires 56 can be compression bonded, or the like, to the chip bonding pads 54 and to the ends of the conductive paths 26.

An advantage provided by the U-shaped base member 12 is that, because of the vertically extending side walls 16, the chip 52 and the bonding wires 56 are at least partially surrounded by rigid members, whereby, during further handling of the chip containing base members, there is little risk of mechanical damage of the chip or bonding wires.

With the chip 52 in place, the lead frame 40 is then disposed (FIG. 1) over the base member 12 with the various leads 44 and 46 overlying and contacting respective ones of the conductive paths 26. Note that the leads 44 connected to the two bars 48 contact respective conductive paths 26 on the base member flanges 18. Conversely, the leads 46 connected to the bar 50 contact conductive paths 26 on the inner surface of the bottom wall 14. Because the bottom wall is a a lower level than the flanges 18, the leads 46 are provided with a small down-set out of the plane of the frame.

Then, all the leads are bonded to their respective conductive paths. This can be done using conventional processes, e.g., compression welding, soldering, or adhesive bonding using an electrically conductive silver epoxy. Although not illustrated, small dots of solder or conductive silver epoxy can be pre-applied to the ends of the leads 44 and 46 and/or the ends of the conductive paths 26 for forming the bonding joints.

Another advantage provided by the rigid base member 12 is that for each bonded joint, that is, the bonding wires 56 to the chip 52 and to the conductive paths 26, and the leads 44 and 46 to conductive paths 26 on the base member, one of the members being bonded is part of a rigid member. This allows the use of firm pressure during the bonding and the formation of reliable bonds. Thus, by "rigid and strong" is meant sufficient rigidity and strength to provide mechanical protection of the chip and bonding wire during batch handling and random contacting of base member sub-assemblies and sufficient rigidity to provide a non-yielding substrate to conventional bonding tool pressures.

After completion of the lead frame assembly, with a chip 52 bonded and wired in place on the base member 12, the entire base member and portions of the lead frame adjacent thereto are encapsulated in an enclosure using known encapsulating means. For example, the base member 12 is disposed in a mold and a fluidized encapsulating material is squeezed into the mold to form the enclosure. As shown in FIG. 3, the non-encapsulated portions of the lead frame extend outwardly from the enclosure 60. Then, the portions of the lead frame serving as supports for the various leads, i.e., the side rails 42 and the bars 48 and 50 are removed, as by being severed along the dashed lines 62 shown in FIG. 3, for electrically and mechanically separating the various leads 44 and 46 from each other. The individual leads serve as terminals for the encapsulated device.

As previously described, a continuous, unpatterned layer 32 (FIG. 2) of conductive material is disposed on the under surfaces of the base member 12. This layer is preferably electrically connected to one of the terminal leads 44 which provides means for grounding the layer 32 with respect to electrical apparatus with which the encapsulated semiconductor device is used. This provides electrical shielding of the encapsulated chip 52.

In one embodiment, illustrated by dashed lines in FIG. 2, a more complete shielding is provided by disposing a second base member 12a in inverted relation to the base member 12 of a complete lead frame assembly. The flanges 18 of the two base members overlie one another and are bonded together to form a continuous (but open ended) structure surrounding the chip 52. The conductive layers 32 of the two base members are electrically interconnected, e.g., by means of overlapping and bonded together conductive paths 26 each of which is electrically connected to its respective layer 32 via the extension 34 of the layer 32.

FIG. 2 also shows a second semiconductor chip 52a bonded and wired to the second base member 12a. The two base members 12 and 12a can be identical, including the presence of identical patterns of conductive paths 26 on the two base members, or different patterns of conductive paths can be used. This is discussed hereinafter.

In assembly of the two-part structure shown in FIG. 2, the two separate base members 12 and 12a are first provided with their respective bonded and wired chips 52 and 52A, a lead frame 40 is then combined with the base member 12 as before described, but no lead frame is added to the base member 12a. Rather, the second base member 12a is disposed over the assembly comprising the lead frame 40 and the base member 12, and the flanges 18 of the two base members 12 and 12a are bonded together by means of bonds between various conductive paths 26 on the flanges 18 of the base member 12a and various ones of the leads 44 and 40 of the lead frame 40. Depending upon the patterns of the conductive paths on the flanges of the two base members 12 and 12a, different bonding and electrical interconnection arrangements are provided.

In one such arrangement, for example, conductive paths on facing surfaces of the flanges of the two base members overlap one another and sandwich therebetween a single lead. Thus, the portions of the two chips electrically connected to the overlapping conductive paths are electrically interconnected to one another as well as to the sandwiched lead.

In another arrangement, no lead is present between the overlapping conductive paths, and the overlapping paths, with a suitable conductive bridging member therebetween equal in thickness to the missing lead, simply interconnect portions of the two chips.

In still another arrangement, conductive paths on one of the flanges do not overlap conductive paths on the facing flange, but rather only overlap and contact respective leads. The contacted leads thus serve as terminals for one but not both chips.

An advantage of the two base member assembly shown in FIG. 2 is that two semiconductor chips 52 and 52a can be simply and economically incorporated within a single device including various electrical connections between and for the two chips. Also, effective electrical shielding is provided for the two chips.

In another embodiment, not illustrated, the second chip 52a is omitted from the second base member 12a, and the base member 12a serves merely for electrically shielding the chip 52 on the base member 12. For cost savings, conductive paths can be omitted from the inside surfaces of the base member 12a.

As previously noted, in the preferred embodiment, the base member 12 is open-ended, that is, having two spaced apart side walls 16 rather than a single, continuous encircling wall. An advantage of the open-ended structure, and particularly when two base members 12 and 12a are combined, is that the plastic encapsulating material can freely enter the base member(s) and entirely fill the space therewithin. This is desirable in the finished devices because it better excludes the possibility of water vapor entering the device and condensing water within voids otherwise present in the devices.

What is claimed is:

1. A lead frame assembly for the fabrication of semiconductor devices, the assembly comprising a first base member having a generally dished configuration including a bottom wall and an upwardly extending first side wall at an edge of said bottom wall, said bottom wall having upper and lower oppositely disposed surfaces, said side wall having inner and outer oppositely disposed surfaces, said base member having a first flange disposed at an upper end of said side wall and extending laterally outwardly therefrom, a plurality of conductive paths disposed on said upper surface of said bottom wall, said conductive paths having first ends disposed on said upper surface, and said conductive paths extending upwardly along said inner surface of said side wall and onto the flange extending therefrom, a layer of electrically conductive material disposed on said lower surface of said bottom wall and on said outer surface of said side wall, and a lead frame comprising a plurality of cantilevered leads extending from a support portion of said frame, said leads overlying and being bonded to respective conductive paths on said flange.

2. A lead frame assembly for the fabrication of semiconductor devices, the assembly comprising a first base member having a generally dished configuration including a bottom wall and an upwardly extending first side wall at an edge of said bottom wall, said bottom wall having upper and lower oppositely disposed surfaces, said side wall having inner and outer oppositely disposed surfaces, said base member having a first flange disposed at an upper end of said side wall and extending laterally outwardly therefrom, a plurality of conductive paths disposed on said upper surface of said bottom wall, said conductive paths having first ends disposed on said upper surface, and said conductive paths extending upwardly along said inner surface of said side wall and onto the flange extending therefrom, and a lead frame comprising a plurality of cantilevered leads extending from a support portion of said frame, said leads overlying and being bonded to respective conductive paths on said flange, said base member having a trough-like configuration including an upwardly extending second side wall at an edge of said bottom wall and oppositely disposed to said first side wall, said second wall having inner and outer oppositely disposed surfaces, a second flange disposed at an upper end of said side wall and extending laterally outwardly therefrom, conductive paths on said bottom wall extending along said second side wall and onto said second flange, leads of said lead frame overlying and being bonded to respective conductive paths on said second flange, said first and second flanges each having an upper and lower surface, and including a layer of electrically conductive material disposed on said lower surface of said bottom wall, on the outer surfaces of said side walls, and on the lower surfaces of said flanges.

3. A lead frame assembly for the fabrication of semiconductor devices, the assembly comprising a first base member having a generally openended, trough-like configuration including a bottom wall and a pair of oppositely disposed, upwardly extending side walls, each of said side walls being disposed at a respective one of a first pair of oppositely disposed edges of said bottom wall, said side walls being spaced apart, and defining open ends of said trough-like base member, along a second pair of oppositely disposed edges of said bottom wall, said second pair of edges extending transversely to said first pair of edges, said bottom wall having upper and lower oppositely disposed surfaces, said side walls each having inner and outer oppositely disposed surfaces, said base member having a pair of flanges disposed one each at an upper end of each of said side walls and extending laterally outwardly therefrom, a plurality of conductive paths disposed on said upper surface of said bottom wall, said conductive paths having first ends disposed on said upper surface, and respective ones of said conductive paths extending upwardly along said inner surface of each of said side walls and onto the flange extending therefrom, and a lead frame comprising a plurality of cantilevered leads extending from a support portion of said frame, said leads overlying and being bonded to respective conductive paths on said flanges.

4. An assembly according to claim 3 wherein said flanges each has an upper and lower surface, and including a layer of electrically conductive material disposed on said lower surface of said bottom wall, on the outer surfaces of said side walls, and on the lower surfaces of said flanges.

5. An assembly according to claim 1 wherein said first ends of said conductive paths are disposed adjacent to a mounting area on said upper surface of said bottom wall, a first semiconductor chip mounted on said mounting area, and means electrically interconnecting said conductive path first ends with respective portions of said chip.

6. An assembly according to claim 1 including means for electrically connecting one of said leads to said conductive material layer.

7. An assembly according to claim 1 wherein said flange has upper and lower surfaces, said conductive paths are disposed on said upper surface of said flange, and said layer of conductive material is disposed on said lower surface of said flange.

8. An assembly according to claim 7 wherein said conductive layer includes an extension thereof joined to one of said conductive paths on said flange.

9. An assembly according to claim 2 wherein said first ends of said conductive paths are disposed adjacent to a mounting area on said upper surface of said bottom wall, a first semiconductor chip mounted on said mounting area, and means electrically interconnecting said conductive path first ends with respective portions of said chip.

10. An assembly according to claim 9 including a second base member substantially identical to said first base member with respect to hereinafter referred to portions of said second base member, said second base member being secured to said first base member in inverted relation therewith, each of two flanges of said second base member overlapping a respective flange of said first base member, and conductive paths on the flanges of said second member overlying and being bonded to respective ones of said leads.

11. An assembly according to claim 10 including a second semiconductor chip mounted on a mounting area of said second base member, and means electrically interconnecting portions of said second chip to conductive path first ends on said second base member.

12. An assembly according to claim 11 wherein an electrically conductive layer on said second base member is electrically connected to said electrically conductive layer on said first base member.

* * * * *